US007687749B2

(12) United States Patent
Ochiai et al.

(10) Patent No.: US 7,687,749 B2
(45) Date of Patent: Mar. 30, 2010

(54) MAGNETRON FOR MICROWAVE OVEN

(75) Inventors: Hiroshi Ochiai, Kawachi-gun (JP); Etsuo Saitou, Kawachi-gun (JP); Yoshimasa Suzuki, Simotuga-gun (JP); Nagisa Kuwahara, Kawachi-gun (JP)

(73) Assignee: Panasonic Corporation, Osaka (JP)

( * ) Notice: Subject to any disclaimer, the term of this patent is extended or adjusted under 35 U.S.C. 154(b) by 604 days.

(21) Appl. No.: 11/406,338

(22) Filed: Apr. 19, 2006

(65) Prior Publication Data

US 2006/0238129 A1 Oct. 26, 2006

(30) Foreign Application Priority Data

Apr. 26, 2005 (JP) ........................... P2005-128194
Aug. 31, 2005 (JP) ........................... P2005-251881

(51) Int. Cl.
*H05B 6/72* (2006.01)
*H03B 9/10* (2006.01)

(52) U.S. Cl. ........................................ 219/761; 331/86

(58) Field of Classification Search ................. 219/761, 219/702, 741, 746, 777, 779, 780; 315/39.51, 315/39.53, 39.71, 39.75, 85, 105; 333/182
See application file for complete search history.

(56) References Cited

U.S. PATENT DOCUMENTS 5,438,182 A * 8/1995 Choi .......................... 219/702
6,404,301 B1 * 6/2002 Park et al. ................... 333/182
6,650,057 B2 * 11/2003 Murao et al. ............. 315/39.51
2002/0175627 A1 11/2002 Murao et al.

FOREIGN PATENT DOCUMENTS

EP 0 696 878 A2 2/1996
EP 1 261 015 A2 11/2002
JP 52-075101 A 6/1977
JP 57-17344 4/1982

OTHER PUBLICATIONS

European Search Report issued in corresponding European Patent Application No. EP 06 00 8116, dated Sep. 15, 2006.

* cited by examiner

*Primary Examiner*—Daniel L Robinson
(74) *Attorney, Agent, or Firm*—McDermott Will & Emery LLP

(57) ABSTRACT

It is an object to provide a magnetron for a small-sized microwave oven which takes safety standards and a noise into consideration, in a magnetron 10 for a microwave oven, a pair of choke coils 16 and 17 are provided in a filter case 11, and a height H1 of the internal surface of the filter case 11 is set to be 35 to 45 mm, an outside diameter d3 of an air-core type inductance 25 is set to be 5.5 to 7.5 mm and a sectional area S of a high frequency absorbing member 27 is set to be 5 to 16 $mm^2$. In the magnetron 10 for a microwave oven, an electrostatic capacity between capacitor terminals 15A and 15B and the filter case 11 is increased to be 500 to 700 pF.

2 Claims, 13 Drawing Sheets

MAGNETRON FOR MICROWAVE OVEN

BACKGROUND OF THE INVENTION

1. Field of the Invention

The present invention relates to a magnetron to be used in a microwave oven.

2. Description of the Related Art

A conventional magnetron for a microwave oven comprises a choke coil 51 in a filter case 50, and has an end 51A of the choke coil 51 connected to a cathode input conductor 52 and the other end 51B of the choke coil 51 connected to a terminal 53A of a capacitor 53, and the capacitor 53 is provided on a side wall of the filter case 50 as shown in FIG. 14.

The choke coil 51 can solve the following problem. More specifically, an air-core type inductance 55 and a core type inductance 56 having a bar-shaped high frequency absorbing member (ferrite core) 57 in a winding are connected in series so that the dielectric breakdown of a winding in the choke coil 51 is burned to cause an insulation failure or the crack of the ferrite core 57 is generated (for example, JP-B-57-17344 Publication).

A magnetron for a microwave oven is greatly required to have a reduction in a size in order to maintain a large inner part of a microwave oven. In order to meet the requirement, a magnetron having a small height of the filter case 50 has been necessary. However, the magnetron for the microwave oven is to maintain a distance from the choke coil 51 to the filter case 50 which is equal to or greater than a specified value in order to satisfy safety standards. In the magnetron for the microwave oven, moreover, restrictions on a noise are severe differently from an industrial magnetron.

The magnetron serves to generate a high frequency in a space having a complicated structure. For this reason, a result of a simulation (a free space) and a result of an experiment are greatly different from each other. In other words, it is impossible to predict an influence in the case in which a size is reduced.

SUMMARY OF THE INVENTION

The invention has been made in consideration of the circumstances and has an object to provide a magnetron for a small-sized microwave oven which takes safety standards and a noise into consideration.

The invention provides a magnetron for a microwave oven comprising, in a filter case, a pair of choke coils in which an air-core type inductance and a core type inductance including a high frequency absorbing member in a winding are connected in series, one of ends of each of the choke coils being connected to each of a pair of cathode input conductors and the other end of each of the choke coils being connected to each of a pair of terminals of a capacitor, wherein a height of an internal surface of the filter case is set to be 35 to 45 mm, an outside diameter of the air-core type inductance is set to be 5.5 to 7.5 mm and a sectional area of the high frequency absorbing member of the core type inductance is set to be 5 to 16 $mm^2$, and an electrostatic capacity between the terminal of the capacitor and the filter case is maintained to be 500 to 700 pF.

According to the structure, the filter case can be made compact. By reducing the shape of the choke coil, moreover, it is possible to maintain a distance from the choke coil to the filter case corresponding to a standard value. Therefore, the safety standards can be satisfied. In addition, it is possible to suppress the generation of a noise in a frequency band of 400 MHz to 700 MHz.

In the design of an ordinary magnetron for a microwave oven, a change in the size of a choke coil is not carried out in order to avoid a problem that a noise is generated. In the magnetron for a microwave oven according to the invention, however, it is possible to implement a decrease in a size and a reduction in a noise while satisfying the safety standards based on a new knowledge of a relationship of an electrostatic capacity with a noise between the dimension of the filter case or the terminal of the capacitor and the filter case.

Moreover, a microwave oven according to the invention comprises the magnetron for a microwave oven according to the invention.

According to the invention, it is possible to produce an advantage that the size of the magnetron for a microwave oven can be reduced and the safety standards can be satisfied, and furthermore, a noise can be reduced.

DESCRIPTION OF THE PREFERRED EMBODIMENTS

Figure 1:
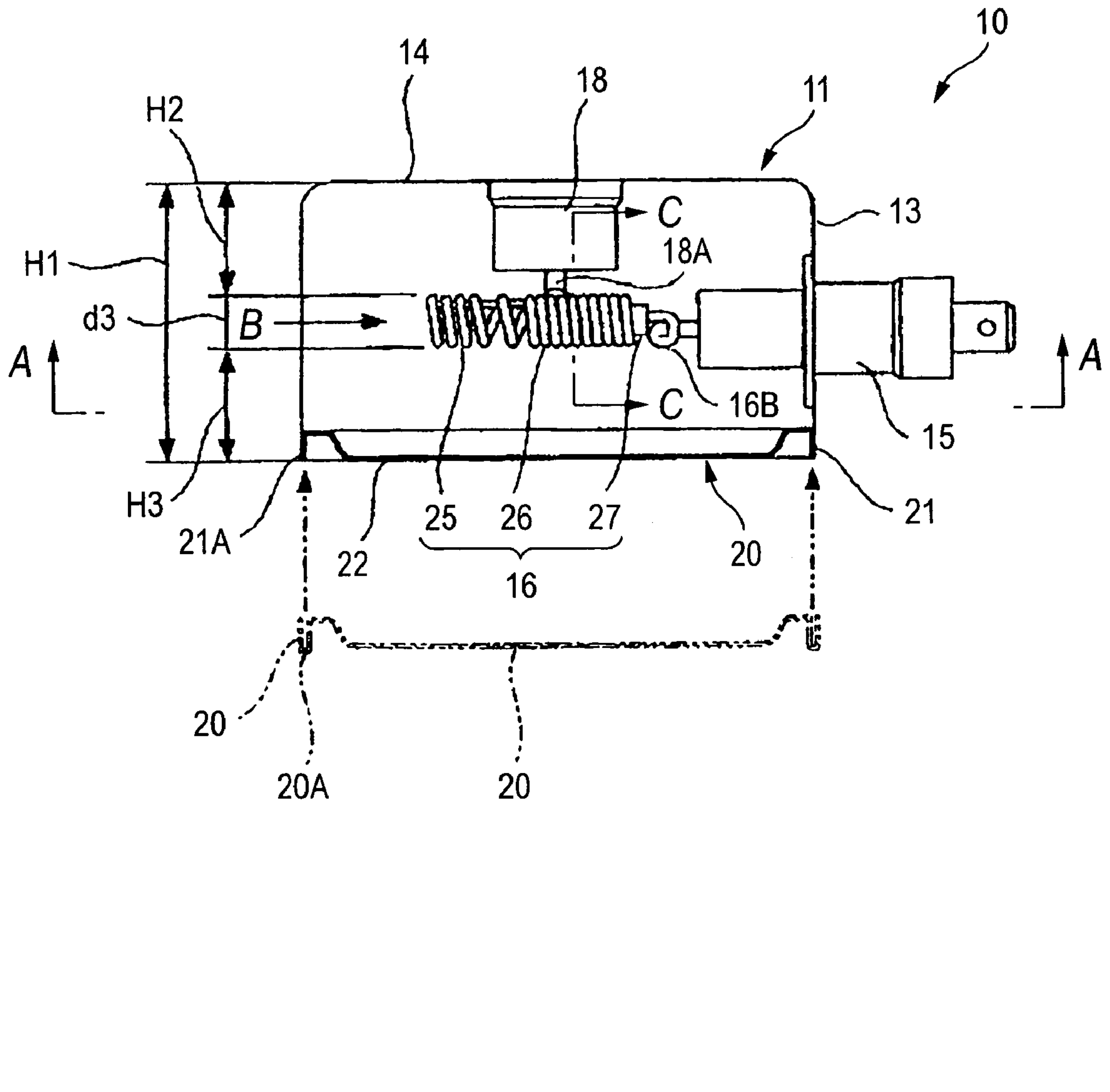
FIG. 1 is a sectional view showing a magnetron according to an embodiment of the invention.
Figure 2:
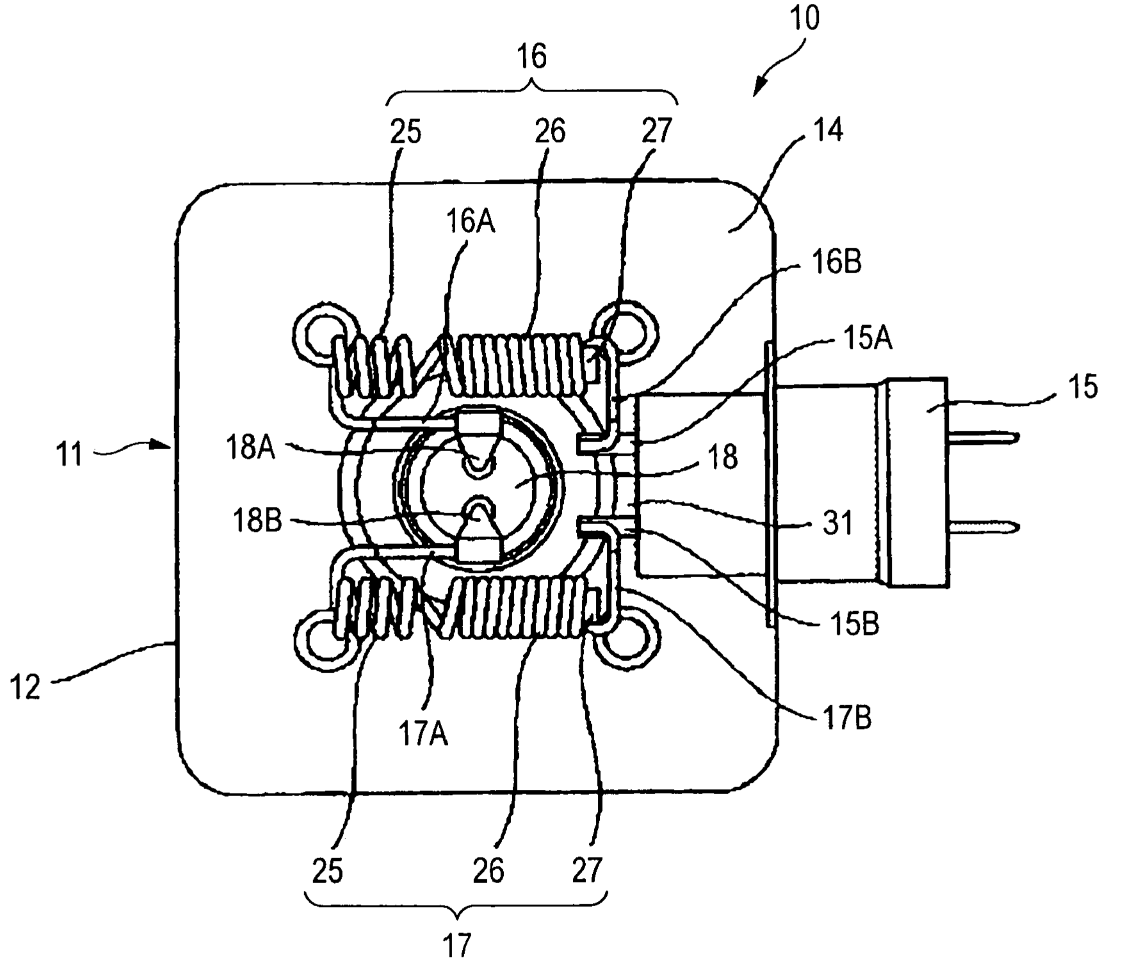
FIG. 2 is a sectional view taken along an A-A line in FIG. 1.

As shown in FIGS. 1 and 2, a magnetron 10 for a microwave oven according to an embodiment of the invention (which will be hereinafter referred to as a "magnetron 10") comprises a filter case 11, a capacitor 15 is provided on a side wall 13 of the filter case 11 and a pair of choke coils 16 and 17 are provided in the filter case 11. The choke coils 16 and 17 and the capacitor 15 constitute a so-called LC filter circuit.

In the filter case 11, a cathode input portion 18 is provided on the center of a ceiling portion 14 of a case body 12, the capacitor 15 is provided on the center of the side wall 13 and the opening of the case body 12 is sealed with a cover member 20.

The capacitor 15 has a pair of capacitor terminals 15A and 15B protruded into the filter case 11.

The cathode input portion 18 has a pair of cathode input conductors 18A and 18B protruded into the filter case 11.

The cover member 20 includes a fitting peripheral wall 21 which can be fitted in an opening peripheral wall of the case body 12, and a bulged portion 22 surrounded by the fitting peripheral wall 21 is bulged downward and the bulged portion 22 is formed on almost the level with a lower end 21A of the fitting peripheral wall 21. The bulged portion 22 is formed on almost the level with the lower end 21A of the fitting peripheral wall 21 so that a height H1 of the internal surface of the filter case 11 is set to be 35 to 45 mm.

The choke coil 16 is obtained by connecting an air-core type inductance 25 and a core type inductance 26 having a bar-shaped high frequency absorbing member (that is, a ferrite core) 27 in a winding in series.

The choke coil 16 has an end 16A connected to the cathode input conductor 18A and the other end 16B connected to the capacitor terminal 15A. The end 16A is an end provided on the air-core type inductance 25 side and the other end 16B is an end provided on the core type inductance 26 side.

Figure 3:
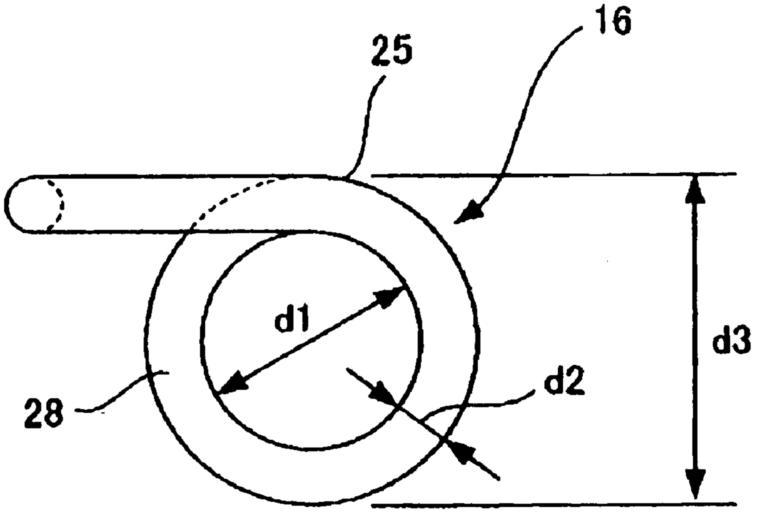
FIG. 3 is a view seen in a direction of an arrow B in FIG. 1.

As shown in FIG. 3, the air-core type inductance 25 is obtained by roughly winding, like a coil, a winding 28 formed by a copper material and is formed to have an inside diameter d1 of 2.5 to 4.5 mm. In the air-core type inductance 25, the winding 28 has a line diameter d2 of 1.4 mm and an outside diameter d3 of 5.5 to 7.5 mm.

Figure 4:
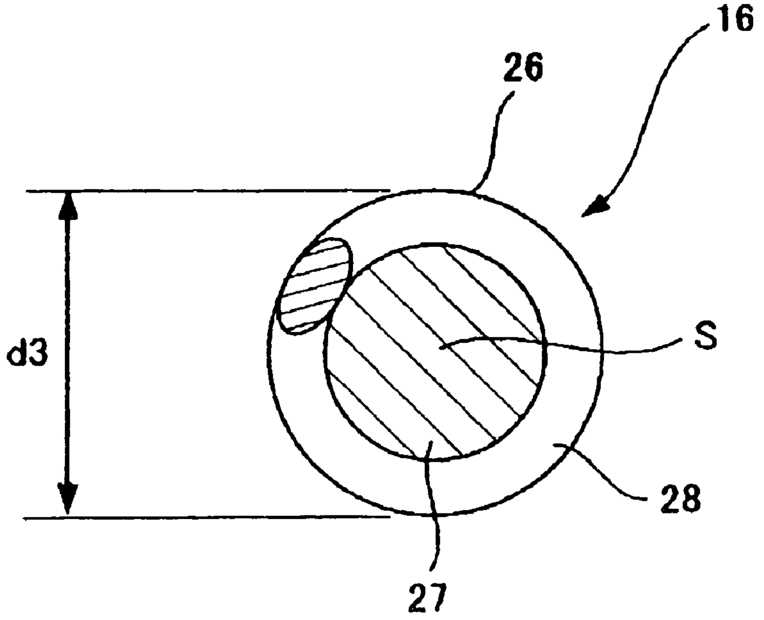
FIG. 4 is a sectional view taken along a C-C line in FIG. 1.

As shown in FIG. 4, the core type inductance 26 includes the high frequency absorbing member 27 by winding, like a coil, the winding 28 formed by a copper material around the high frequency absorbing member 27. The high frequency absorbing member 27 has a sectional area S set to be 5 to 16 $mm^2$. The core type inductance 26 has a small outside diameter d3 of 5.5 to 7.5 mm in the same manner as the air-core type inductance 25.

The other choke coil 17 shown in FIG. 2 has an end 17A connected to the other cathode input conductor 18B and the other end 17B connected to the other capacitor terminal 15B. The other choke coil 17 is a member which is line symmetrical with the choke coil 16, and the same reference numerals as those of the components of the choke coil 16 are attached to the other choke coil 17 and detailed description will be omitted.

By setting the outside diameters d3 of the choke coils 16 and 17 to be small, that is, 5.5 to 7.5 mm, it is possible to maintain a distance H2 (see FIG. 1) between the choke coils 16 and 17 and the ceiling portion 14 of the filter case 11 to be equal to or greater than a standard value of 14.5 mm and to maintain a distance H3 (see FIG. 1) between the choke coils 16 and 17 and the bulged portion 22 of the cover member 20 to be equal to or greater than 14.5 mm even if the height H1 of the internal surface of the filter case 11 is set to be small, that is, 35 to 45 mm.

Figure 5:
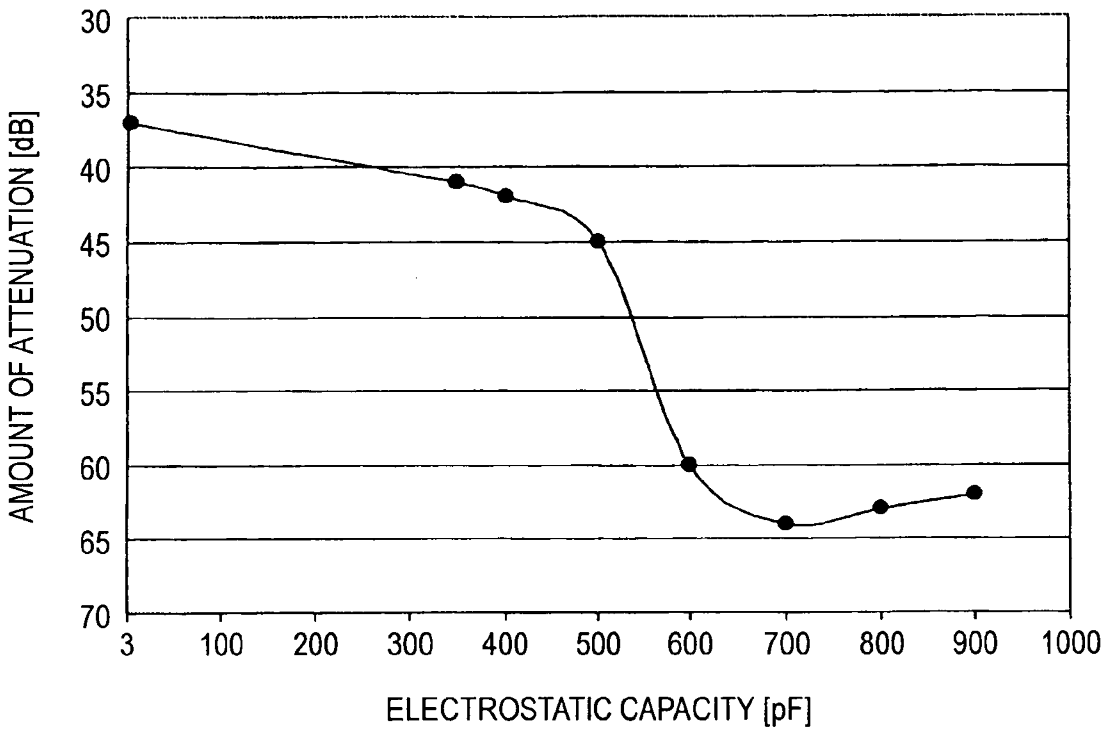
FIG. 5 is a graph showing the amount of an attenuation of a noise in a 400 MHz band with respect to an electrostatic capacity between a capacitor terminal and a filter case.

FIG. 5 shows a change in the amount of an attenuation of a noise in a 400 MHz band for an electrostatic capacity between the capacitor terminals 15A and 15B and the filter case 11 in a filter circuit in which the internal surface of the filter case 11 has a height of 40 mm, the high frequency absorbing member (ferrite core) 27 has a diameter of ϕ3.0 mm and the inductance is 1 μH. In FIG. 5, it is apparent that an ordinary (conventional) magnetron has an electrostatic capacity between a capacitor terminal and a filter case of 350 to 400 pF and the amount of an attenuation of the noise is increased by setting the electrostatic capacity to be equal to or larger than 500 pF. When the electrostatic capacity is equal to or larger than 750 pF, however, a vibration sound (a so-called electrostrictive sound) is generated from a capacitor when the magnetron is conducted (during an operation), which is not practically preferable. For this reason, an optimum electrostatic capacity is 500 to 700 pF.

The magnetron 10 is formed to enhance a dielectric constant ∈ of a dielectric material of the capacitor 15 and to improve an electrostatic capacity in order to maintain the electrostatic capacity to be 500 to 700 pF in the capacitor terminals 15A and 15B and the filter case 11.

By an enhancement in the electrostatic capacity of the capacitor, furthermore, it is possible to suppress the generation of a space wave noise and to implement a reduction in a noise at a frequency in a 400 to 700 MHz band.

Figure 6:
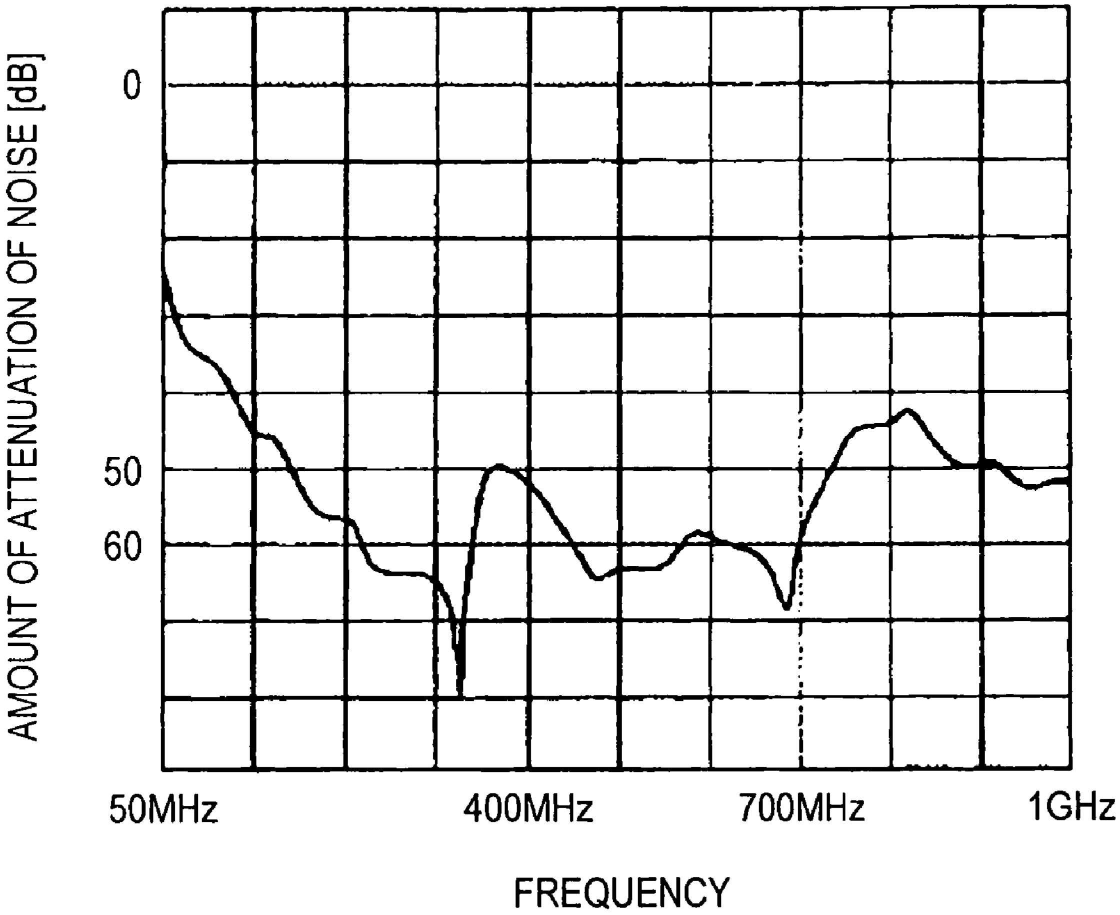
FIG. 6 is a graph showing the amount of an attenuation of a noise in the magnetron according to the embodiment of the invention.
Figure 15:
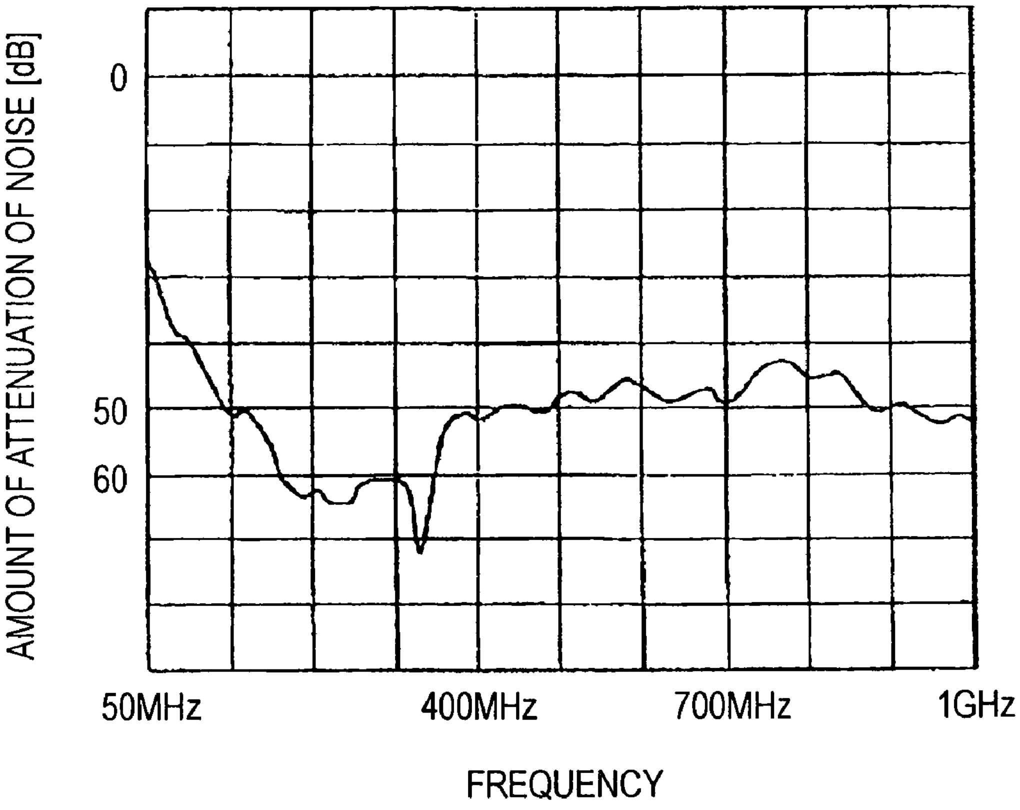
FIG. 15 is a graph showing the amount of a reduction in a noise of the conventional magnetron.

FIG. 6 is a graph for explaining a reduction in the noise of the magnetron 10. FIG. 15 is a graph for explaining a reduction in the noise of a conventional magnetron. In the graphs of FIGS. 6 and 15, an axis of ordinate indicates an amount of an attenuation of a noise and an axis of abscissa indicates a frequency. According to the graph of FIG. 15, it is apparent that a space wave noise is attenuated by approximately 50 dB at a frequency in a 400 to 700 MHz band in the conventional magnetron. According to the graph of FIG. 6, it is apparent that a space wave noise is attenuated by approximately 60 dB at a frequency in a 400 to 700 MHz band in the magnetron according to the embodiment.

Figure 7:
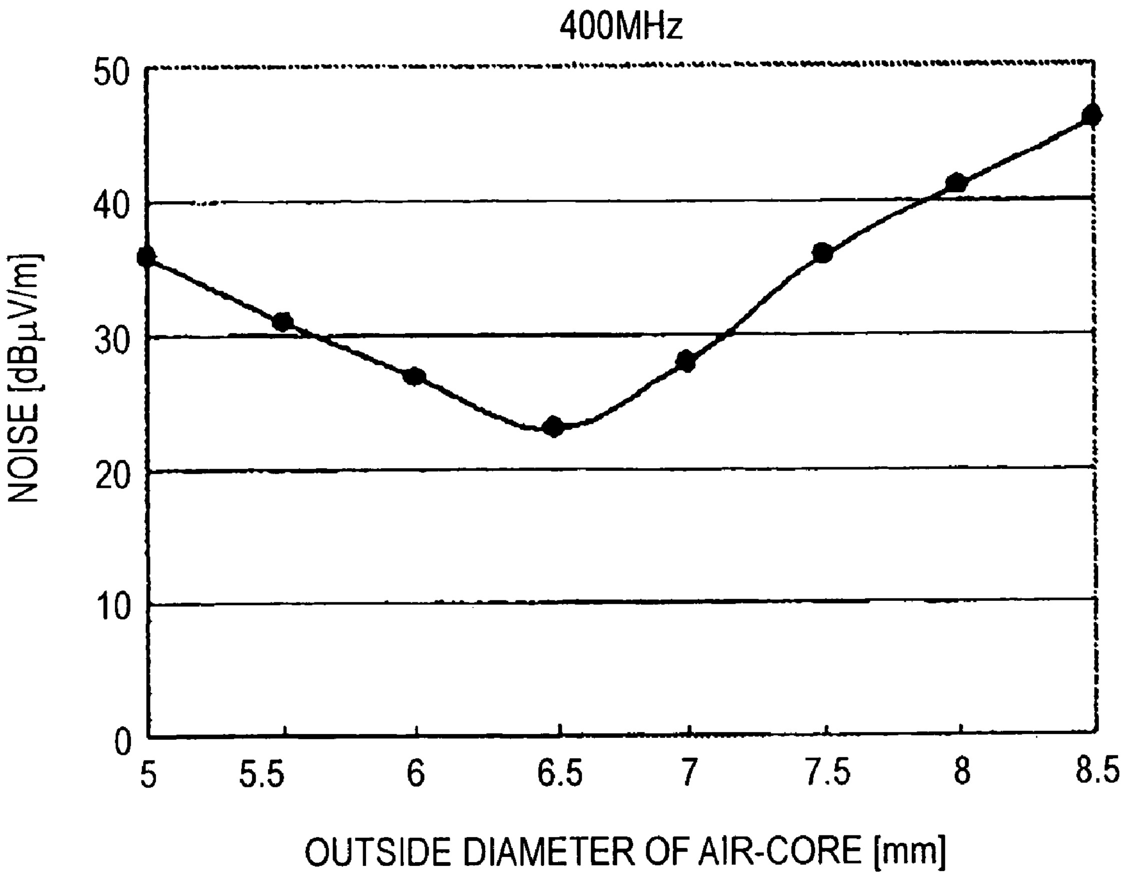
FIG. 7 is a graph showing a space wave noise level (400 MHz) in a change in the outside diameter of an air-core type inductance.
Figure 8:
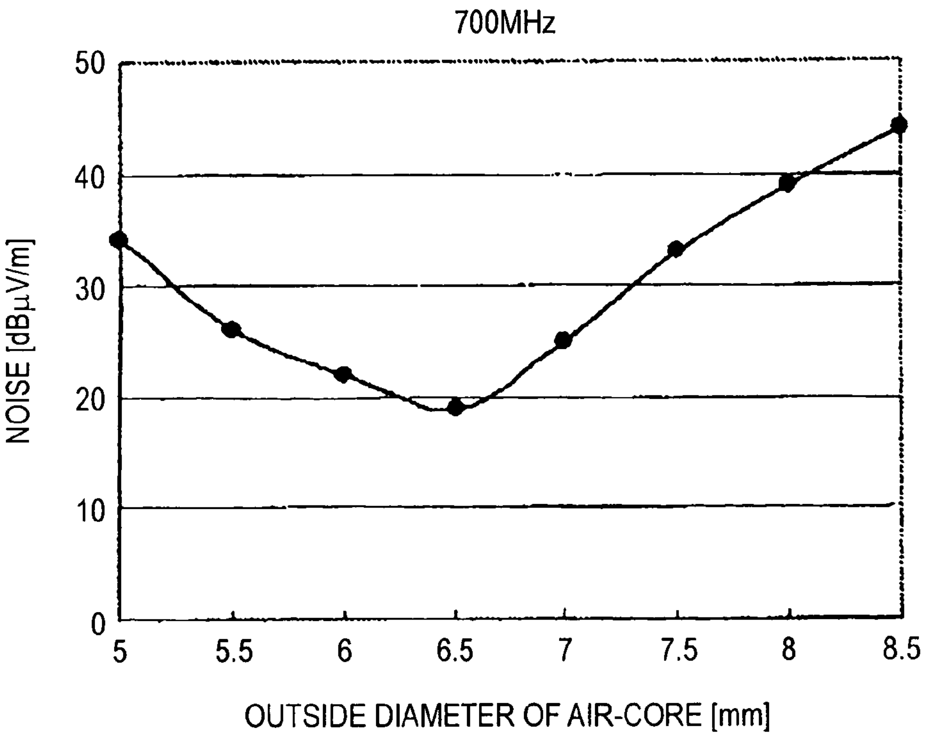
FIG. 8 is a graph showing a space wave noise level (700 MHz) in the change in the outside diameter of the air-core type inductance.

There was confirmed a relationship between an outside diameter of the air-core type inductance and a noise level in a frequency band in which a remarkable noise attenuating effect is obtained based on the electrostatic capacity of the capacitor. FIGS. 7 and 8 show a space wave noise level (400 MHz and 700 MHz) in a change in the outside diameter of the air-core type inductance. In graphs shown in FIGS. 7 and 8, an axis of ordinate indicates a noise level and an axis of abscissa indicates an outside diameter of the air-core type inductance. As compared with the conventional case in which the outside diameter is 8.0 mm, it is apparent that a remarkable noise improving effect can be obtained in an outside diameter of 5.5 to 7.5 mm. FIGS. 7 and 8 show both ends of a frequency band of 400 MHz to 700 MHz. Also in other intermediate regions, the same tendency of the noise improving effect was obtained.

Figure 9:
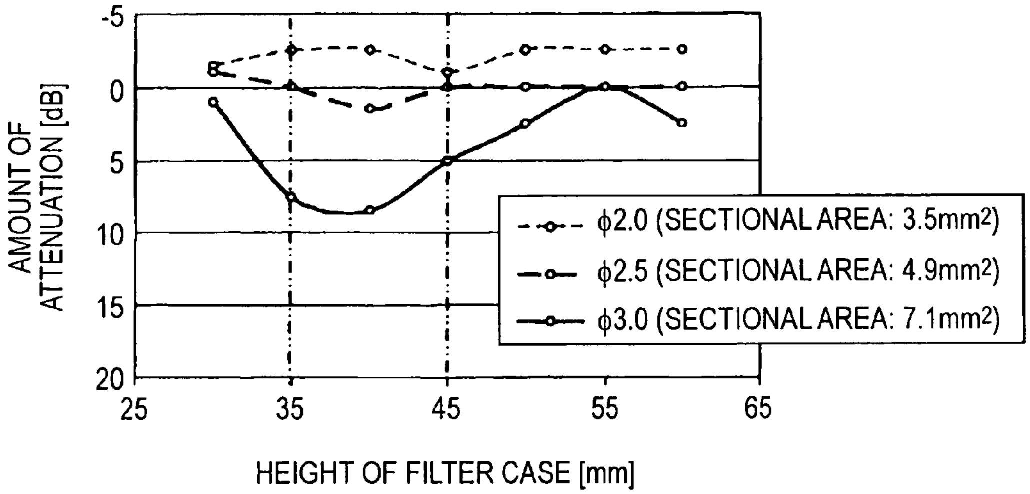
FIG. 9 is a graph showing a space wave noise level (400 MHz) in a change in a diameter of a ferrite core (ϕ2.0 mm, ϕ2.5 mm, ϕ3.0 mm) of a core type inductance.
Figure 10:
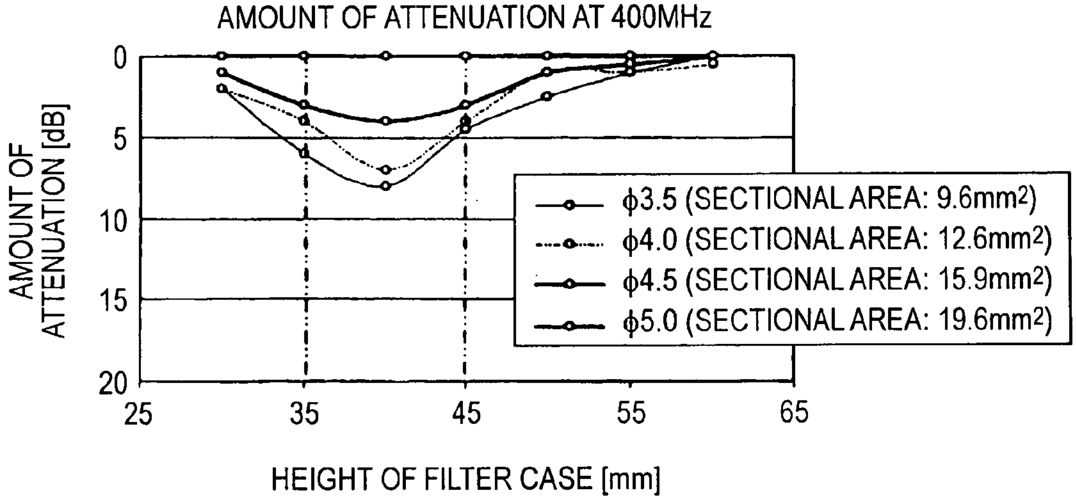
FIG. 10 is a graph showing a space wave noise level (400 MHz) in a change in a diameter of a ferrite core (3.5 mm, ϕ4.0 mm, ϕ4.5 mm) of the core type inductance.

By using a microwave oven having an output of 1000 W and mounting the magnetron 10 in which the filter case 11 has a width of 70 mm×70 mm and the choke coils 16 and 17 having different diameters of the ferrite core 27 are provided, the amount of an attenuation of a noise in a 400 MHz band was confirmed. FIGS. 9 and 10 show a result of the confirmation. In this case, in the choke coils 16 and 17, a copper material having a line diameter of 1.4 mm was wound around the ferrite core 27 of the core type inductance 26 and the inductance was maintained to be 1 μH.

FIGS. 9 and 10 show a relationship between the height of the internal surface of the filter case in a diameter of the ferrite core 27 in the core type inductance 26 and the amount of an attenuation of a noise in the 400 MHz band. FIG. 9 is a graph obtained when the ferrite core 27 having diameters of ϕ2.0 mm (a sectional area of 3.5 $mm^2$), ϕ2.5 mm (a sectional area of 4.9 $mm^2$), and ϕ3.0 mm (a sectional area of 7.1 $mm^2$) is used in the magnetron 10, and FIG. 10 is a graph obtained when the ferrite core 27 having diameters of ϕ3.5 mm (a sectional area of 9.6 $mm^2$), ϕ4.0 mm (a sectional area of 12.6 $mm^2$), and ϕ4.5 mm (a sectional area of 15.9 $mm^2$) is used in the magnetron 10. In the graphs shown in FIGS. 9 and 10, an axis of ordinate indicates the amount of an attenuation of a noise and an axis of abscissa indicates a height of the internal surface of the filter case. The graphs are obtained by setting the amount of a noise in a conventional magnetron (a ferrite core having a diameter of 5.0 mm and a sectional area of 19.6 $mm^2$) to be a reference value (a level of an attenuation amount of zero) and setting the amount of a noise in the diameter of each ferrite core to be the amount of an attenuation.

According to the graphs in FIGS. 9 and 10, it is apparent that the amount of an attenuation of a noise is enhanced in the diameter of the ferrite core of ϕ2.5 mm to ϕ4.5 mm (approximately 5 to 16 $mm^2$ based on a sectional area conversion) and the height of the internal surface of the filter case of 35 mm to 45 mm. For a maximum advantage, an attenuation of 8.5 dB was obtained in a diameter of the ferrite core of 3.0 mm (approximately 7 $mm^2$ based on a sectional area conversion) and a height of the internal surface of the filter case of 40 mm.

In the embodiment, the description has been given to the attenuation of the space wave noise at the frequency in the 400 to 700 MHz band. According to the magnetron 10 in accordance with the embodiment, it can be confirmed that a noise (line noise) in a frequency band of 100 kHz to 30 MHz can also be reduced.

Figure 11:
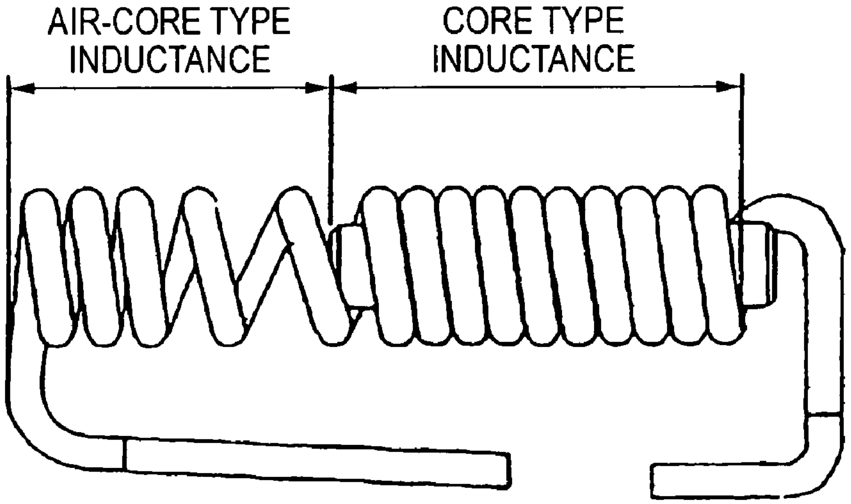
FIG. 11 is a view showing a shape of a choke coil according to the embodiment of the invention.
Figure 12:
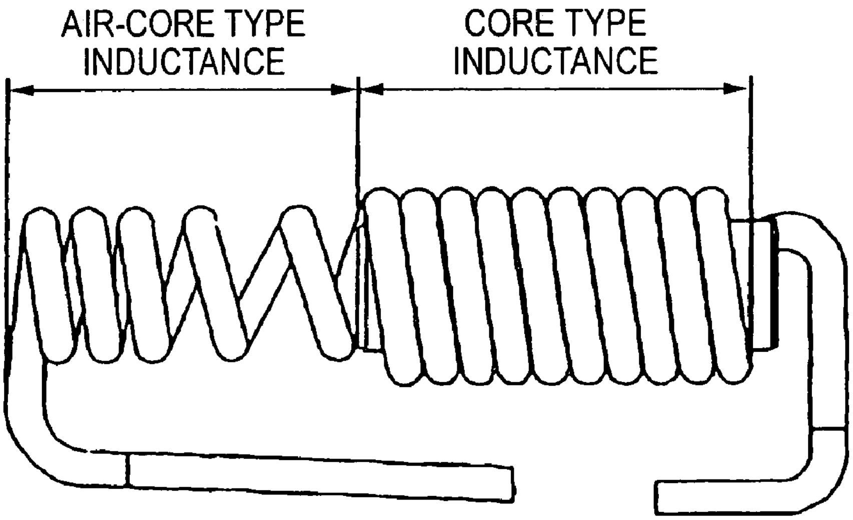
FIG. 12 is a view showing another shape of the choke coil according to the embodiment of the invention.
Figure 13:
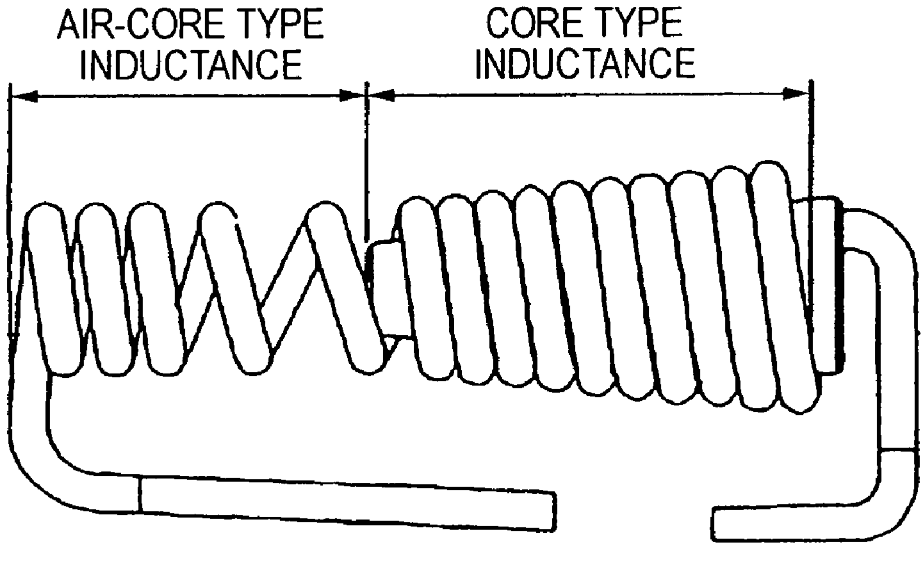
FIG. 13 is a view showing a further shape of the choke coil according to the embodiment of the invention.
Figure 14:
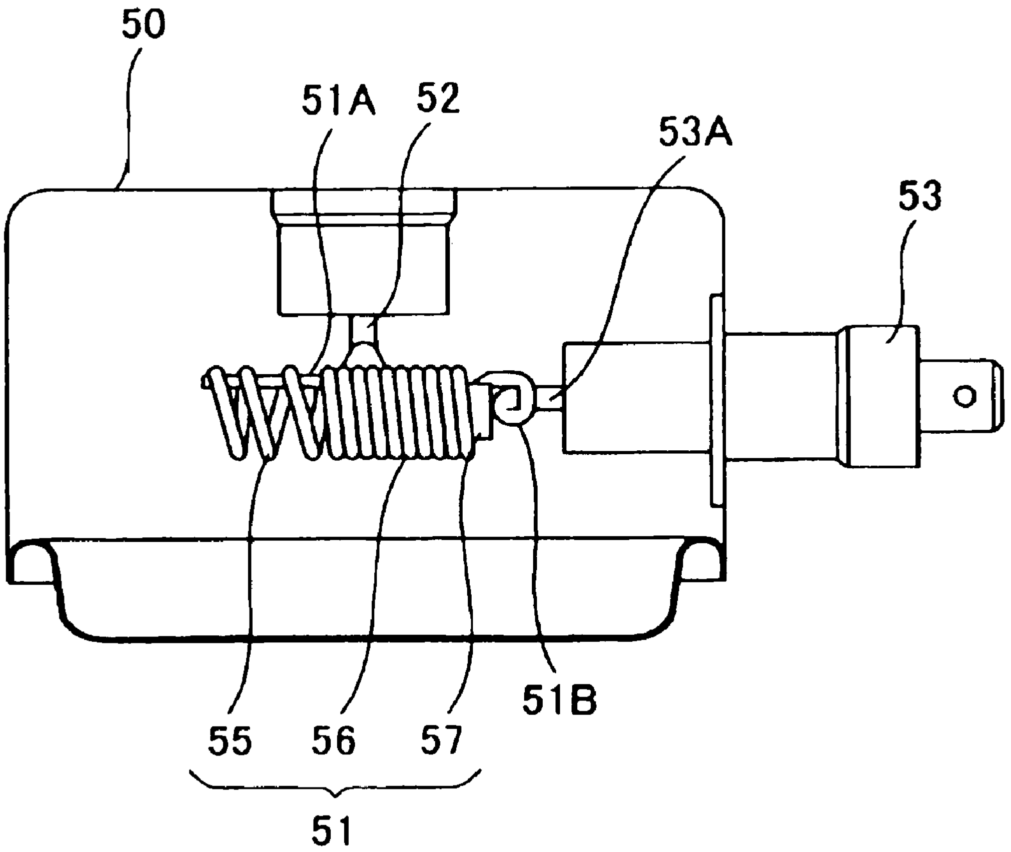
FIG. 14 is a sectional view showing a conventional magnetron.

While the case in which the choke coil takes the shape shown in FIG. 11 (the outside diameter of the core type inductance is equal to that of the air-core type inductance) has been described as an embodiment of the invention, other shapes can be taken if the air-core type inductance has an outside diameter of 5.5 to 7.5 mm and the high frequency absorbing member has a sectional area of 5 to 16 $mm^2$. For example, the outside diameter of the core type inductance may be larger than that of the air-core type inductance as shown in FIG. 12 or the outside diameter of the core type inductance may be changed stepwise as shown in FIG. 13.

The invention is useful for a magnetron which can reduce a size and can satisfy safety standards, and furthermore, has an effect of reducing a noise and is utilized in a microwave oven.

What is claimed is:

1. A magnetron for a microwave oven, comprising:

a filter case; and a pair of choke coils, provided in the filter case, each of the choke coils in which an air-core type inductance and a core type inductance including a high frequency absorbing member in a winding are connected in series, one of ends of each of the choke coils being connected to each of a pair of cathode input conductors and the other end of each of the choke coils being connected to each of a pair of terminals of a capacitor;

wherein a height of an internal surface of the filter case is set to be 35 to 45 mm;

an outside diameter of the air-core type inductance is set to be 5.5 to 7.5 mm and a sectional area of the high frequency absorbing member of the core type inductance is set to be 5 to 16 $mm^2$; and an electrostatic capacity between a terminal of the capacitor and the filter case is maintained to be 500 to 700 pF.

2. The microwave oven comprising the magnetron for a microwave oven according to claim 1.

* * * * *